(12) United States Patent
Alhussien et al.

(10) Patent No.: US 9,106,264 B2
(45) Date of Patent: Aug. 11, 2015

(54) ENCODING AND DECODING IN FLASH MEMORIES USING CONVOLUTIONAL-TYPE LOW-DENSITY PARITY CHECK CODES

(71) Applicant: LSI Corporation, San Jose, CA (US)

(72) Inventors: Abdel Hakim S. Alhussien, San Jose, CA (US); Erich F. Haratsch, Bethlehem, PA (US); Zongwang Li, Dublin, CA (US); Fan Zhang, Milpitas, CA (US)

(*) Notice: Subject to any disclaimer, the term of this patent is extended or adjusted under 35 U.S.C. 154(b) by 335 days.

(21) Appl. No.: 13/755,676

(22) Filed: Jan. 31, 2013

(65) Prior Publication Data

US 2013/0145238 A1    Jun. 6, 2013

Related U.S. Application Data

(63) Continuation-in-part of application No. 12/920,407, filed on Jan. 4, 2011, now Pat. No. 8,724,381, and a continuation-in-part of application No. 13/001,278, filed on Feb. 25, 2011, now Pat. No. 8,462,549, and a continuation-in-part of application No. 13/063,888, filed on Aug. 31, 2011, now Pat. No. 8,830,748, and a continuation-in-part of application No. 13/731,551, filed on Dec. 31, 2012.

(51) Int. Cl.
  *G11C 16/04* (2006.01)
  *H03M 13/23* (2006.01)
  *G06F 11/10* (2006.01)
  *H03M 13/11* (2006.01)

(52) U.S. Cl.
  CPC ........... *H03M 13/23* (2013.01); *G06F 11/1072* (2013.01); *H03M 13/1154* (2013.01)

(58) Field of Classification Search
  CPC ................. G11C 16/349; G11C 2029/0411
  USPC ................... 365/185.03, 185.02, 230.06
  See application file for complete search history.

(56) References Cited

U.S. PATENT DOCUMENTS

| | | | |
|---|---|---|---|
| 2009/0241008 A1* | 9/2009 | Kim et al. | 714/755 |
| 2009/0241009 A1* | 9/2009 | Kong et al. | 714/763 |
| 2009/0310406 A1* | 12/2009 | Sarin et al. | 365/185.03 |
| 2011/0141815 A1 | 6/2011 | Haratsch et al. | |
| 2011/0145487 A1 | 6/2011 | Haratsch et al. | |
| 2011/0167305 A1 | 7/2011 | Haratsch et al. | |
| 2011/0225350 A1 | 9/2011 | Burger, Jr. et al. | |
| 2014/0059406 A1* | 2/2014 | Hyun et al. | 365/185.03 |
| 2015/0058536 A1* | 2/2015 | Seol et al. | 711/103 |

OTHER PUBLICATIONS

Kudekar et al., "Threshold Saturation via Spacial Coupling: Why Convolutional LDPC Ensembles Perform So Well Over the BEC," IEEE Trans. Inform. Theory, vol. 57, No. 2, pp. 803-834 (2011).
Felstrom et al., "Time-Varying Periodic Convolutional Codes with Low-Density Parity-Check Matrix," IEEE Trans. Inform. Theory, vol. 45, No. 6, pp. 2181-2191 (1999).

* cited by examiner

*Primary Examiner* — Tuan T Nguyen
(74) *Attorney, Agent, or Firm* — Ryan, Mason & Lewis, LLP

(57) ABSTRACT

Methods and apparatus are provided for encoding and decoding in flash memories using convolutional-type low parity density check codes. A plurality of bits to be stored on a flash memory device are encoded using a convolutional-type low density parity check code, such as a spatially coupled low density parity check code. The encoded pages or portions thereof can be decoded independently of other pages. In one embodiment, an encoded page is decoded jointly with one or more additional pages in the same wordline or a different wordline.

20 Claims, 7 Drawing Sheets

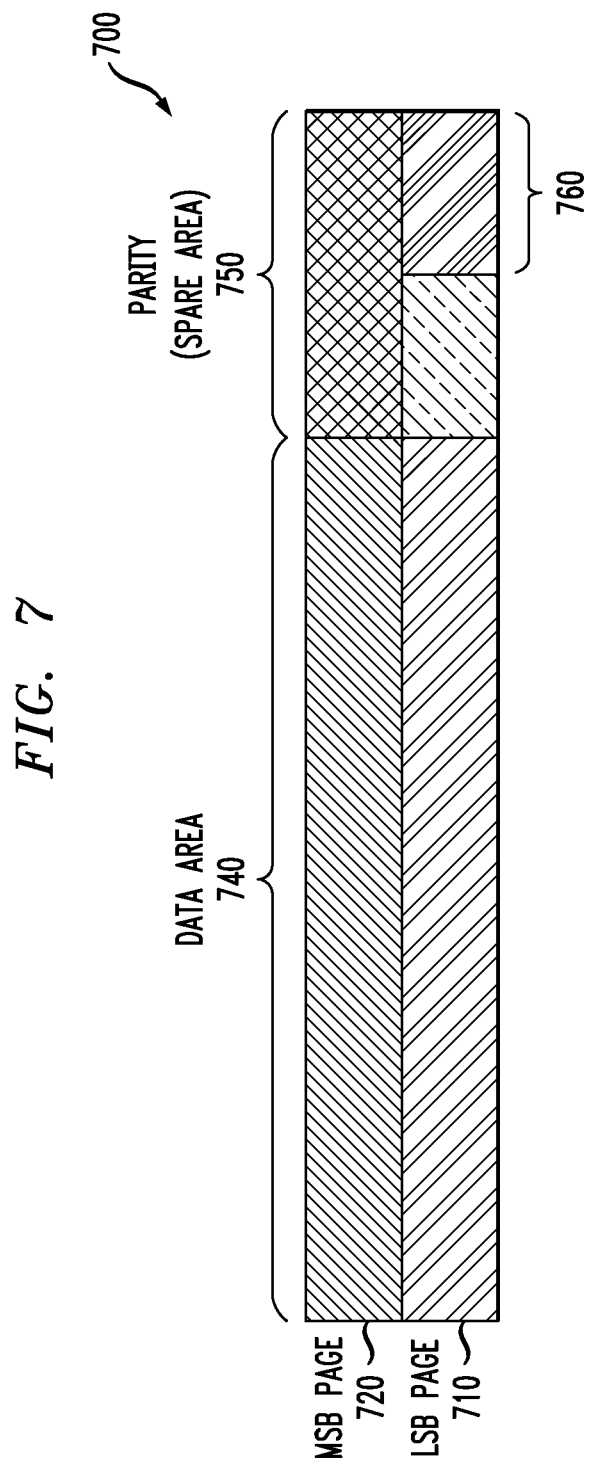

US 9,106,264 B2

ENCODING AND DECODING IN FLASH MEMORIES USING CONVOLUTIONAL-TYPE LOW-DENSITY PARITY CHECK CODES

CROSS-REFERENCE TO RELATED APPLICATIONS

The present application is a continuation-in-part patent application of U.S. patent application Ser. No. 12/920,407, filed Jan. 4, 2011, entitled "Methods and Apparatus for Storing Data in a Multi-Level Cell Flash Memory Device With Cross-Page Sectors, Multi-Page Coding And Per-Page Coding," (now U.S. Pat. No. 8,724,381); U.S. patent application Ser. No. 13/001,278, filed Feb. 25, 2011, entitled "Methods and Apparatus for Read-Side Intercell Interference Mitigation in Flash Memories," (now U.S. Pat. No. 8,462,549); U.S. patent application Ser. No. 13/063,888, filed Aug. 31, 2011, entitled "Methods and Apparatus for Soft Data Generation in Flash Memories," (now U.S. Pat. No. 8,830,748); and U.S. patent application Ser. No. 13/731,551, filed Dec. 31, 2012, entitled "Multi-Tier Detection and Decoding in Flash Memories," each incorporated by reference herein.

FIELD

The present invention relates generally to flash memory devices and more particularly, to improved techniques for mitigating the effect of noise, inter-cell interference and other distortions in such flash memory devices with low overall processing delay.

BACKGROUND

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

The analog values stored in memory cells are often distorted. The distortions are typically due to, for example, back pattern dependency (BPD), noise and inter-cell interference (ICI).

A number of techniques have been proposed or suggested for mitigating the effect of ICI by reducing the capacitive coupling between cells. While there are available methods to reduce the effect of ICI and other noise, it is important that such ICI and noise mitigation techniques do not unnecessarily impair the write-read speeds for flash control systems. Thus, many effective signal processing and error correction coding techniques are avoided that would introduce significant inherent processing delays. Foregoing such complex signal processing techniques, however, reduces the ability of a flash control system to maintain sufficient detection and decoding accuracy as flash device geometries scale down.

The smallest writable data unit in a flash memory device is referred to as a page. A page can comprise several codewords of a read channel error correction code (ECC), which is the smallest readable data unit. Depending on the mapping of page bits into memory cell voltages, there is usually a significant statistical correlation among errors in pages mapped to the same wordline. Thus, it has been recognized that there are benefits to coding across multiple pages. In order to maintain high write and read speeds in flash memory devices, however, pages are typically written and decoded on-the-fly, independently from other pages. A need therefore exists for an ECC design that allows a page to be decoded on-the-fly in a normal mode of operation, while also supporting decoding of a wordline comprised of multiple pages if a failure occurs.

SUMMARY

Generally, methods and apparatus are provided for encoding and decoding in flash memories using convolutional-type low parity density check codes. According to one aspect of the invention, a plurality of bits to be stored on a flash memory device are encoded using a convolutional-type low density parity check code, such as a spatially coupled low density parity check code.

According to a further aspect of the invention, the encoded pages or portions thereof are decoded independently of other pages. In one embodiment, an encoded page is decoded jointly with one or more additional pages in the same wordline or a different wordline.

According to another aspect of the invention, one or more parity bits are encoded in a parity area of a page, and wherein a portion of the parity area for at least one page of a given wordline is allocated for parity bits for at least one other page of the given wordline based on a relative error of the pages.

A more complete understanding of the present invention, as well as further features and advantages of the present invention, will be obtained by reference to the following detailed description and drawings.

BRIEF DESCRIPTION OF THE DRAWINGS

FIG. 7 illustrates intra-wordline encoding using SCLDPC in accordance with an embodiment of the invention.

DETAILED DESCRIPTION

Figure 1:
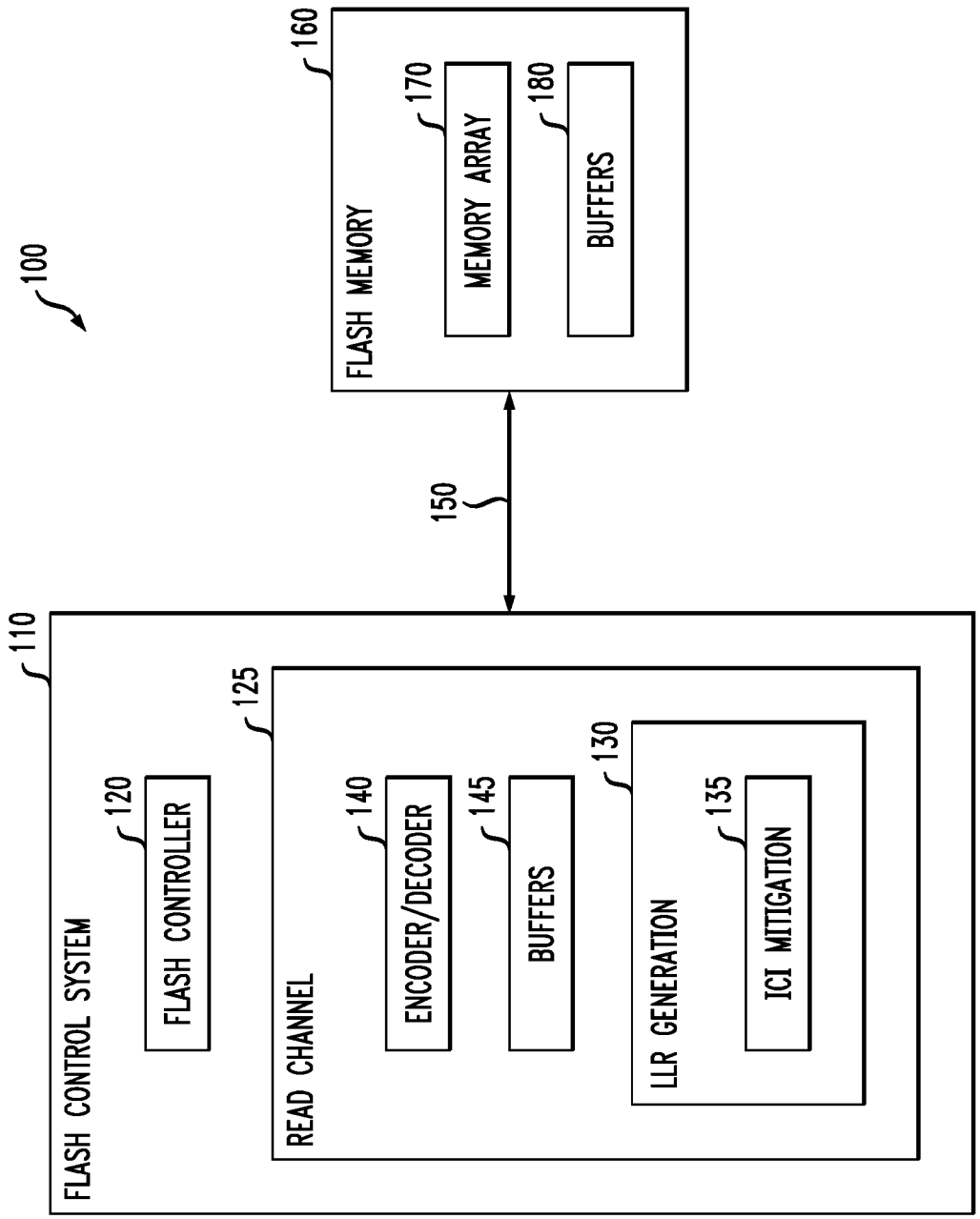
FIG. 1 is a schematic block diagram of an exemplary flash memory system incorporating detection and error correction techniques in accordance with the present invention.

Various aspects of the invention are directed to signal processing and ECC techniques for mitigating ICI, noise and other distortions in memory devices, such as single-level cell or multi-level cell (MLC) NAND flash memory devices. As used herein, a multi-level cell flash memory comprises a memory where each memory cell, stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages, currents or resistances to represent stored data, as would be apparent to a person of ordinary skill in the art.

Aspects of the present invention provide encoding and decoding techniques with error processing that do not unnecessarily impair the read speeds for flash read channels. According to one aspect of the invention, encoding and decoding techniques are provided that account for error correlations between neighboring bits. According to as further aspect of the invention, convolutional-type Low-Density Parity Check (LDPC) codes are used to encode the data in order to permit variable decoding length granularity based on the organization of the stored data. In one exemplary embodiment, the convolutional-type LDPC codes comprise spatially coupled low-density parity check codes (SCLDPC) (also referred to as convolutional LDPC). In various embodiments, the SCLDPC codes span all pages in a single wordline or as many as several wordlines. SCLDPCs enable both full and partial codeword decoding without significant performance impairment.

According to one aspect of the invention, SCLDPC encoding permits failed pages in a flash device to be recovered by single-shot decoding of the failed page along with other pages in a given wordline even though the individual pages are encoded incrementally, or in other words, as they become available. This is possible due to the fact that convolutional type LDPC codes employ continuous encoding in which parity is generated as the user bits become available. However, a requirement of continuous encoding is that the state of the encoder is saved until all the desired pages are encoded and written to the flash device. In spite of this, continuous encoding does not require substantial additional memory, as the amount of information that needs to be saved is small. The encoder state in this context means that the encoder registers storing the encoder state are not cleared from one page bit stream to another, and thus the code chain is not broken and can extend seamlessly from one page to the other. In one exemplary embodiment, a given page is independently decoded on-the-fly during normal operation. If the page fails to decode during the normal mode, then additional pages in the same wordline are read, and their reliabilities or log-likelihood ratios (LLRs) are generated and passed to the LDPC decoder to decode the current and additional pages concurrently. Aspects of the present invention recognize that SCLDPC codes support decoding any block size without having to read the remaining data in the page, via windowed decoding.

To account for inter-wordline correlation (e.g., intercell interference) caused by cell capacitive coupling, encoding across wordlines can optionally be employed. In all-bit-line architectures, odd and even pages are not interleaved and odd and even pages groups can be encoded using separate SCLDPCs.

FIG. 1 is a schematic block diagram of an exemplary flash memory system 100 incorporating detection and coding techniques in accordance with aspects of the present invention. As shown in FIG. 1, the exemplary flash memory system 100 comprises a flash control system 110 and a flash memory block 160, connected by an interface 150. The exemplary flash control system 110 comprises a flash controller 120, and a read channel 125. Moreover, the read channel 125 further comprises an encoder/decoder 140, buffers 145 and an LLR generation block 130. Finally, the LLR generation block 130 further comprises an ICI mitigation block 135.

As discussed further below in conjunction with FIG. 4, the exemplary flash controller 120 implements one or more detection and error correction coding/decoding processes (discussed further below in conjunction with FIGS. 5-7) that incorporate aspects of the present invention.

The exemplary read channel 125 comprises an encoder/decoder block 140 and one or more buffers 145. It is noted that the term "read channel" can encompass the write channel as well. In an alternative embodiment, the encoder/decoder block 140 and some buffers 145 may be implemented inside the flash controller 120. The encoder/decoder block 140 and buffers 145 may be implemented, for example, using well-known commercially available techniques and/or products, as modified herein to provide the features and functions of the present invention.

Generally, as discussed further below in conjunction with FIGS. 4-7, the exemplary LLR generation block 130 processes one or more read values from the flash memory 160, such as single bit hard values and/or quantized multi-bit soft values, and generates reliability and LLR values that are applied to the decoder 140, such as an exemplary low density parity check (LDPC) decoder. In this disclosure, the terms reliability and LLR values are used interchangeably, and approximations of LLRs are included in this definition as well.

In the exemplary embodiment, the exemplary ICI mitigation block 135 is a function in the LLR generation block 130 that accounts for interference between physically adjacent cells in generating the LLR sequence.

The exemplary flash memory block 160 comprises a memory array 170 and one or more buffers 180 that may each be implemented using well-known commercially available techniques and/or products.

In various embodiments of the disclosed detection and coding/decoding techniques, the exemplary interface 150 may need to convey additional information relative to a conventional flash memory system, such as values representing information associated with aggressor cells. Thus, the interface 150 may need to have a higher capacity or faster rate than an interface in conventional flash memory systems. On the other hand, in other embodiments, this additional information is conveyed to flash controller 120 in a sequential manner which would incur additional delays. However those additional delays do not notably increase the overall delay due to their rare occurrence. When additional capacity is desired, the interface 150 may optionally be implemented, for example, in accordance with the teachings of International PCT Patent Application Serial No. PCT/US09/49328, filed Jun. 30, 2009, entitled "Methods and Apparatus for Interfacing Between a Flash Memory Controller and a Flash Memory Array", incorporated by reference herein, which increases the information-carrying capacity of the interface 150 using, for example, Double Data Rate (DDR) techniques.

During a write operation, the interface 150 transfers the program values to be stored in the target cells, typically using page or wordline level access techniques. For a more detailed discussion of exemplary page or wordline level access techniques, see, for example, International Patent Application Serial No. PCT/US09/36110, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

During a read operation, the interface 150 transfers hard and/or soft read values that have been obtained from the memory array 170 for target and/or aggressor cells. For example, in addition to read values for the page with the target cell, read values for one or more neighboring pages in neighboring wordlines or neighboring even or odd bit lines are transferred over the interface 150. In the embodiment of FIG. 1, the disclosed detection and coding/decoding techniques are implemented outside the flash memory 160, typically in a process technology optimized for logic circuits to achieve the lowest area. It is at the expense, however, of the additional aggressor cell data that must be transferred on the interface 150.

Figure 2:
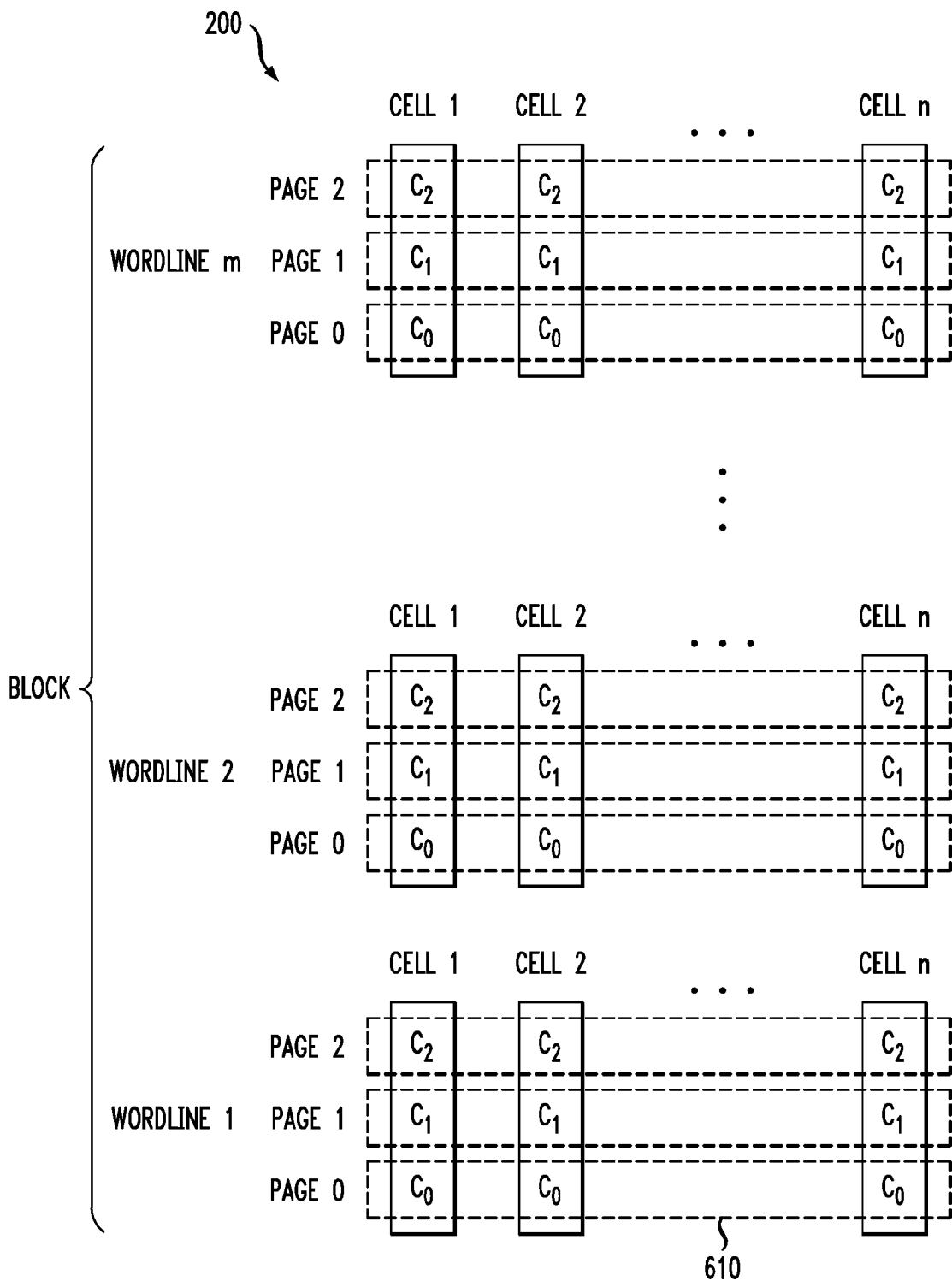
FIG. 2 illustrates an exemplary flash cell array in a multi-level cell (MLC) flash memory device in further detail.

FIG. 2 illustrates an exemplary flash cell array 200 in a multi-level cell (MLC) flash memory device 160 in further detail. As shown in FIG. 2, the exemplary flash cell array 200 stores three bits per flash cell, $c_i$. FIG. 2 illustrates the flash cell array architecture for one block, where each exemplary cell typically corresponds to a floating-gate transistor that stores three bits. The exemplary cell array 200 comprises m wordlines and n bitlines. Typically, in current multi-page cell flash memories, the bits within a single cell belong to different pages. In the example of FIG. 2, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where, for example, cells with even numbers (such as cells 2 and 4 in FIG. 2) correspond to even pages, and cells with odd numbers (such as cells 1 and 3 in FIG. 2) correspond to odd pages. In this case, a page (such as page 0) would contain an even page (even page 0) in even cells and an odd page (odd page 0) in odd cells.

In a two-level cell, for example, each cell stores two bits. In one exemplary implementation, Gray mapping {11, 01, 00, 10} is employed where bits in a cell belong to two different pages. The bits for the two pages in each cell are often referred to as the least significant bit (LSB) and the most significant bit (MSB). For example, if the bit pattern 01 is stored in a cell, "1" is the LSB corresponding to the lower page and "0" is the MSB corresponding to the upper page. In the exemplary embodiment, the lower page is programmed before the upper page. Experimental studies of flash memory devices indicate that, for example, the error event "01"→"10" (pattern "10" is read even though pattern "01" was written) has considerable occurrence probability at the end of device life. In addition, based on an additive white Gaussian noise (AWGN) model, the MSB page often exhibits a higher bit error rate (BER) compared to the LSB page. Thus, it has been found that reading one page improves the BER of the other.

Thus, MSB and LSB errors are known to have statistical correlation, even more so at the end of device life relative to a new flash memory device. Thus, aspects of the present invention provide joint decoding of LSB and MSB pages of a given wordline in the recovery mode, while also being able to decode LSB and MSB pages independently in the normal mode.

Intercell Interference

Figure 3:
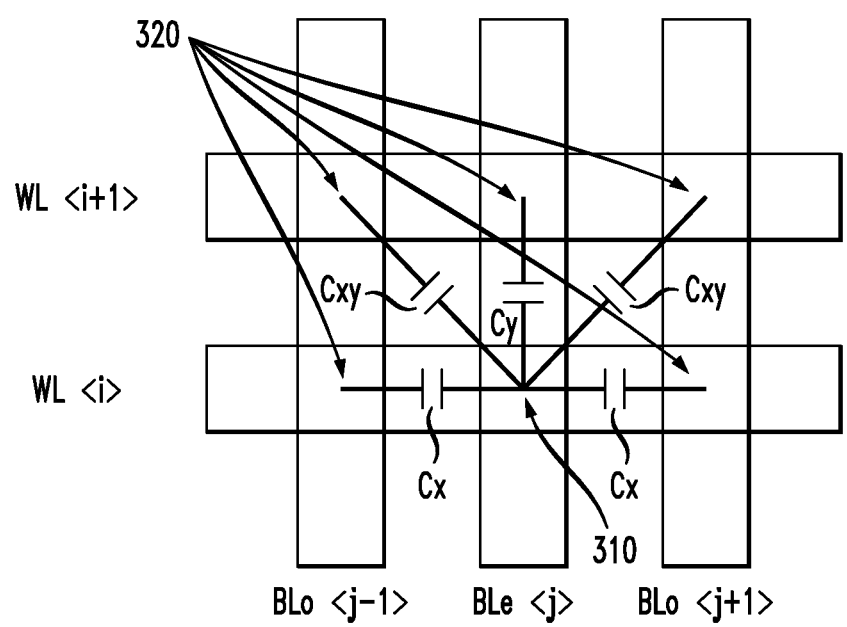
FIG. 3 illustrates the ICI that is present for a target cell due to the parasitic capacitance from a number of exemplary aggressor cells.

ICI is a consequence of parasitic capacitances between cells and is generally considered to be one of the most prominent sources of distortion in flash memories. FIG. 3 illustrates the ICI that is present for a target cell 310 due to the parasitic capacitance from a number of exemplary aggressor cells 320. The following notations are employed in FIG. 3:

WL: wordline;
BL: bitline;
BLo: odd bitline;
BLe: even bitline; and
C: capacitance.

Aspects of the present invention recognize that ICI is caused by aggressor cells 320 that are programmed after the target cell 310 has been programmed. The ICI changes the voltage, $V_t$, of the target cell 310. In one exemplary embodiment, a "bottom up" programming scheme is assumed and adjacent aggressor cells in wordlines i and i+1 cause ICI for the target cell 310. With such bottom-up programming of a block, ICI from the lower wordline i−1 is removed, and up to five neighboring cells contribute to ICI as aggressor cells 320, as shown in FIG. 3. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells are considered. Other cells that are further away from the target cell can be neglected, if their contribution to ICI is negligible. In general, the aggressor cells 320 are identified by analyzing the programming sequence scheme (such as bottom up or even/odd techniques) to identify the aggressor cells 320 that are programmed after a given target cell 310.

The ICI caused by the aggressor cells 320 on the target cell 310 can be modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of aggressor cell (w,b), $\Delta V_{ICI}^{(i,j)}$ is the change in $V_t$ voltage of target cell (i,j) due to ICI and $k_x$, $k_y$, and $k_{xy}$ are capacitive coupling coefficients for the x, y and xy direction.

Generally, $V_t$ is the voltage representing the data stored on a cell and obtained during a read operation. $V_t$ can be obtained by a read operation, for example, as a soft voltage value with more precision than the number of bits stored per cell, or as a value quantized to a hard voltage level with the same resolution as the number of bits stored per cell (e.g., 3 bits for 3 bits/cell flash).

For a detailed discussion of ICI mitigation techniques, see, for example, International Patent Application Serial No. PCT/US09/49326, filed Jun. 30, 2009, entitled "Methods and Apparatus for Read-Side Intercell Interference Mitigation in Flash Memories," incorporated by reference herein. For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008), each incorporated by reference herein.

Figure 4:
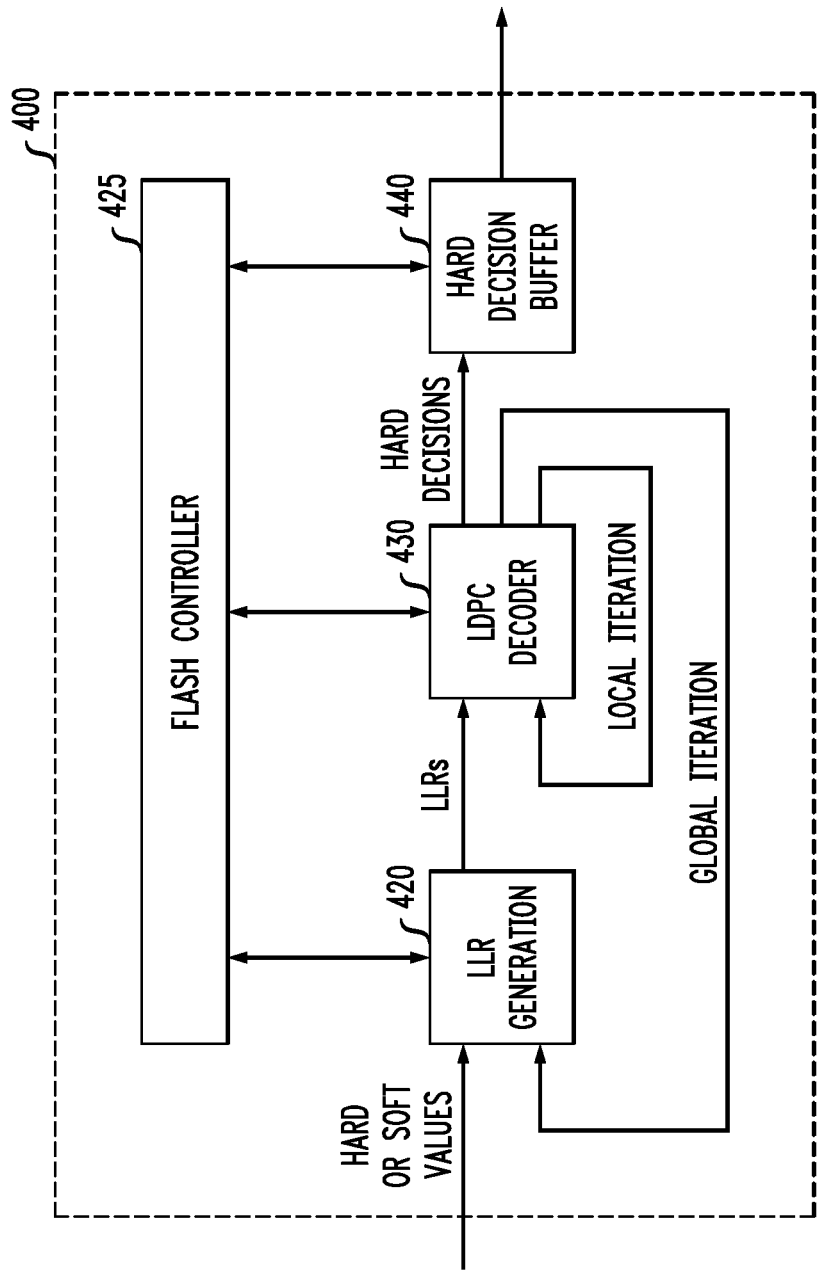
FIG. 4 is a schematic block diagram of an exemplary implementation of a flash memory system incorporating iterative detection and decoding techniques in accordance with aspects of the present invention.

FIG. 4 is a schematic block diagram of an exemplary implementation of a flash memory system 400 incorporating iterative detection and decoding techniques in accordance with aspects of the present invention. As shown in FIG. 4, one or more read values are obtained from the memory array 170 of the flash memory 160. The read values may be, for example, a hard value or a soft value. In a normal mode, for example a read value is obtained for at least one bit in a given page.

In a given processing mode, such as a normal mode or a recovery mode, an exemplary LLR generation block 420 processes the read values from the flash memory 160, such as single bit hard values and/or quantized multi-bit soft values, and generates LLR values that are applied to an exemplary LDPC decoder 430. The LLR generation performed by the exemplary LLR generation block 420 for each mode of the exemplary iterative detection and decoding is discussed further below in a section entitled "LLR generation."

An exemplary flash controller 425 implements one or more detection and coding/decoding processes (discussed further below in conjunction with FIGS. 5-7) that incorporate aspects of the present invention. In addition, as discussed further below, an exemplary LDPC decoder 430 processes the LLRs generated by the exemplary LLR generation block 420 and provides hard decisions that are stored in hard decision buffers 440.

As discussed further below, the exemplary LDPC decoder 430 can iteratively decode the LLR values, e.g., until the read values are successfully decoded. Iterations inside the LDPC decoder are called local iterations. In addition, as discussed further below, in an exemplary recovery mode, the exemplary LLR generation block 420 and the exemplary LDPC decoder 430 can globally iterate until the read values are successfully decoded. For a more detailed discussion of iteration detection and decoding using local and global iterations, see, for example, U.S. patent application Ser. No. 13/063,888, filed Aug. 31, 2011, entitled "Methods and Apparatus for Soft Data Generation in Flash Memories," (now U.S. Pat. No. 8,830,748), incorporated by reference herein.

Figure 5:
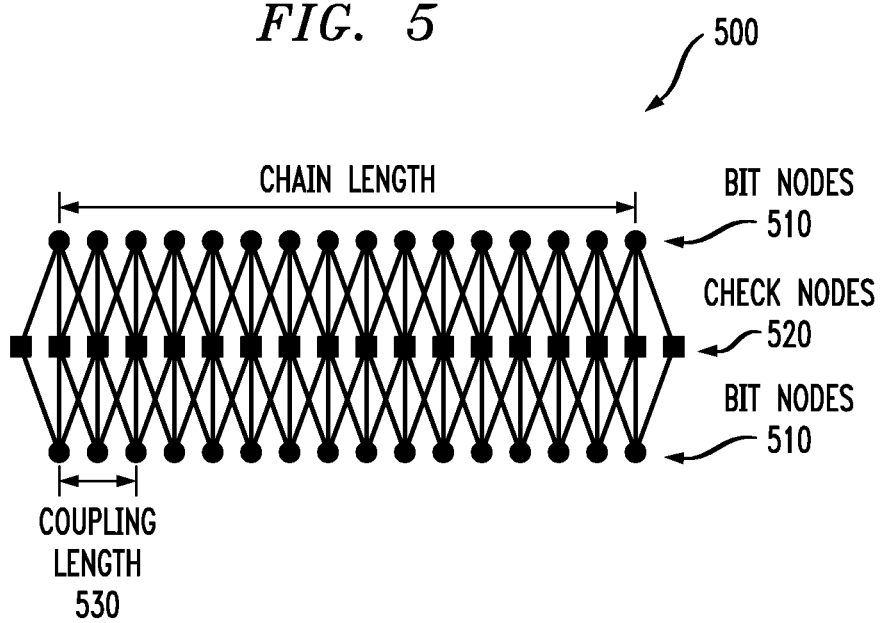
FIG. 5 illustrates an exemplary structure for a (3, 6) spatially coupled LDPC code (SCLDPC) that may be employed by the present invention.

FIG. 5 illustrates an exemplary structure 500 for a (3, 6) spatially coupled LDPC code that may be employed by the present invention. Chain length in this context is another name for the codeword length that is specifically used in SCLDPC codes literature because of their continuous encoding property. For the exemplary (3, 6) spatially coupled LDPC code, each bit node 510 is coupled to 3 check nodes 520, and each check node 520 is connected to 6 bit nodes 510. However, the first and last checks in a chain/codeword are only connected to two bit nodes each, and their neighboring checks are connected to 4 bit nodes each, which is a negligible irregularity in the code that becomes more negligible for longer chains/codewords. The exemplary (3, 6) spatially coupled LDPC code has a coupling length 530 indicating the number of bits that are correlated, which is 3 here. As previously indicated, SCLDPC codes, such as the exemplary (3, 6) SCLDPC code of FIG. 5 encodes data using codewords that have a defined beginning and a variable end. Thus, each page of data that has been encoded using SCLDPC codes, can be decoded either independently or jointly with additional pages that were encoded in one continuous encoding stream.

For a more detailed discussion of suitable SCLDPC codes, see, for example, S. Kudekar et al., "Threshold Saturation via Spatial Coupling: Why Convolutional LDPC Ensembles Perform So Well Over the BEC," IEEE Trans. Inform. Theory, Vol. 57, No. 2, 803-834 (2011), and/or J. Felstrom and K. S. Zigangirov "Time-Varying Periodic Convolutional Codes With Low-Density Parity-Check Matrix," IEEE Trans. Inform. Theory, Vol. 45, No. 6, 2181-2191 (1999), each incorporated by reference herein.

Among other benefits, binary SCLDPC codes have been empirically shown to have a noise threshold that asymptotically approaches the maximum noise threshold of binary symmetric channels (BSC) for large chain lengths. The maximum noise threshold determines how many errors can be tolerated by a given code to provide a successful decoding. Generally, a BSC demonstrates the same probability of error for a binary 0 and a binary 1, and is a good approximation for a flash read channel. However, a BSC is used here, for example, for it is easy to analyze, and SCLDPC can perform just as well on other channels like asymmetric binary channels, where the probability of error for a binary 0 and a binary 1 is not equal, and AWGN channels. In a practical implementation, even with a naïve construction, SCLDPC codes can achieve a better performance-area-power tradeoff compared to conventional random block LDPC codes.

In addition, SCLDPC codes intrinsically support multi-tiered recovery schemes. See, for example, U.S. patent application Ser. No. 13/063,551, filed Dec. 31, 2012, entitled "Multi-Tier Detection and Decoding in Flash Memories," incorporated by reference herein. Generally, shorter chain lengths and higher code rates are suitable for on-the-fly decoding of single pages or fractions thereof with lower decoding, complexity. Likewise, longer chain lengths and lower code rates are suitable for intra-wordline and inter-wordline decoding in the recovery mode. In one exemplary embodiment, over-provisioning (e.g., using a larger portion for parity bits and/or other system bits) permits the use of a lower code rate SCLDPC code. In an over-provisioned embodiment, parity is not constrained within the spare area of each page, and higher decoding complexity and delay are tolerable.

The inherent convolutional structure of SCLDPC codes imposes a maximum distance constraint on the bit nodes connected to the same parity check equations. For instance, two bit nodes that are at least 6 bit locations apart cannot be involved in the same equation in the exemplary code of FIG. 5 (by counting all bit nodes in the exemplary factor graph above and below the check node that share the same checks). This characteristic can be leveraged in order to perform continuous decoding of the received stream through a window that slides along the bit sequence. Moreover, this structure allows for the possibility of parallelizing the iterations of the message passing decoder, through several processors working in different regions of the Tanner graph. This continuous decoding implementation is often referred to as partial windowed decoding, and it enables partial decoding of pages or portions thereof, with a manageable loss in performance (albeit with possibly higher error floors, which could be mitigated by an outer BCH code or other post processing techniques). Hence, SCLDPC codes should be designed to minimize the loss due to windowed partial decoding.

For a further discussion of windowed decoding techniques for convolutional LDPC codes, see, for example, A. E. Pusane et al., "Implementation Aspects of LDPC Convolutional Codes," IEEE Trans. on Communications, Vol. 56, No. 7, 1060-69 (July 2008), incorporated by reference herein.

Figure 6A:
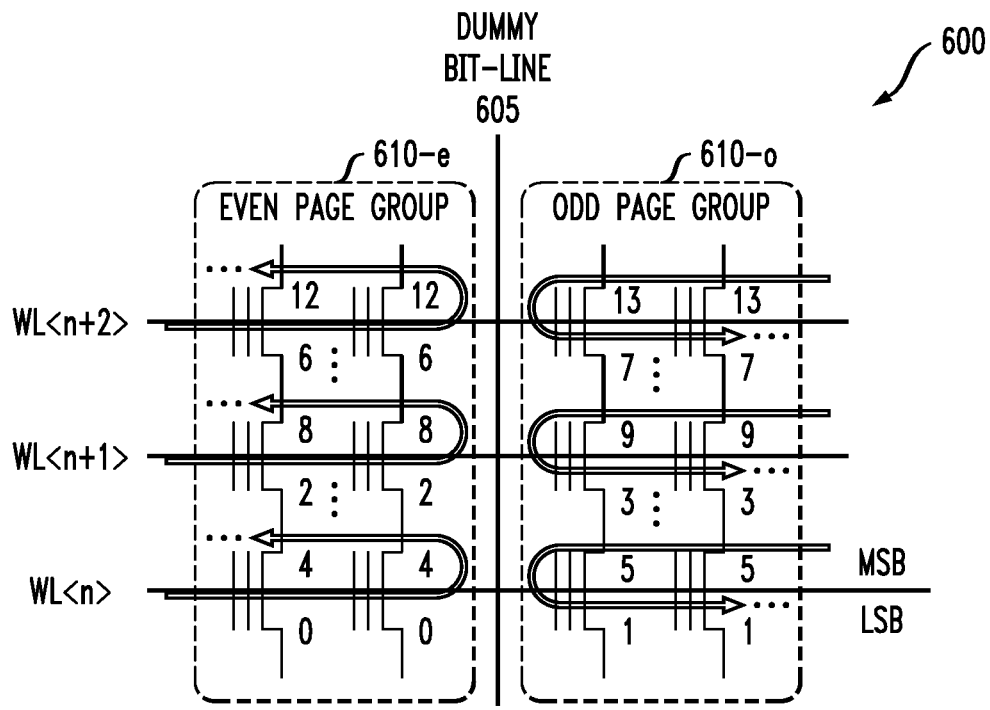
FIG. 6A illustrates an all-bit-line architecture, where even and odd pages groups belong to separate physical planes.

FIG. 6A illustrates an all-bit-line architecture 600, where even and odd pages groups 610-$e$, 610-$o$ belong to separate physical planes (typically separated by a dummy bit-line 605). As shown in FIG. 6A, odd and even pages groups are separately encoded using separate SCLDPC codes. In the exemplary embodiment of FIG. 6A, each wordline WL comprises an LSB or lower page and an MSB or upper page. A page index illustrates an exemplary program order that reduces ICI caused when the upper page (MSB) is written. For example, wordline WL<n> in the even page group 610-$e$ comprises an LSB page with a page index of 0 and an MSB page with a page index of 4. The page index indicates the order in which pages of a block are written: Page 0 is initially written, followed by page 1, and page 2, etc.

Generally, according to one aspect of the invention, the two pages in a given wordline, such as WL<n>, are encoded together, while in prior art embodiments the two pages in a given wordline are typically encoded separately from each other. As shown in FIG. 6A, the LSB page is written first from the LSB beginning bit until the LSB end bit, and then the MSB page is written from the MSB end bit to the MSB beginning bit. Alternatively, the LSB page is encoded first from the LSB beginning bit until the LSB end bit, and after encoding, the bits of the LSB page are written to the flash memory substantially at the same time according to currently available flash programming techniques. Then, the MSB page is encoded from the MSB end bit to the MSB beginning bit, and after encoding, the bits of the MSB page are written to the flash memory substantially at the same time according to currently available flash programming techniques. After the lower page of wordline has been encoded and written, several pages are written to other wordlines before the upper page of that wordline is written. For example, after the lower page 2 has been written to WL<n+1>, pages 3 to 7 are written to other wordlines before the upper page 8 is written to WL<n+1>. Therefore, after the lower page of a wordline has been encoded and written, the encoder state needs to be saved until the upper page of the same wordline is being encoded. In the above example, after the lower page 2 has been encoded, the encoder state is saved until the upper page 8 is being encoded so that both pages 2 and 8 are encoded together. The convolutional-type LDPC encoding in accordance with aspects of the present invention permits partial decoding of the SCLDPC codes for intra-wordline and inter-wordline decoding across several wordlines.

Figure 6B:
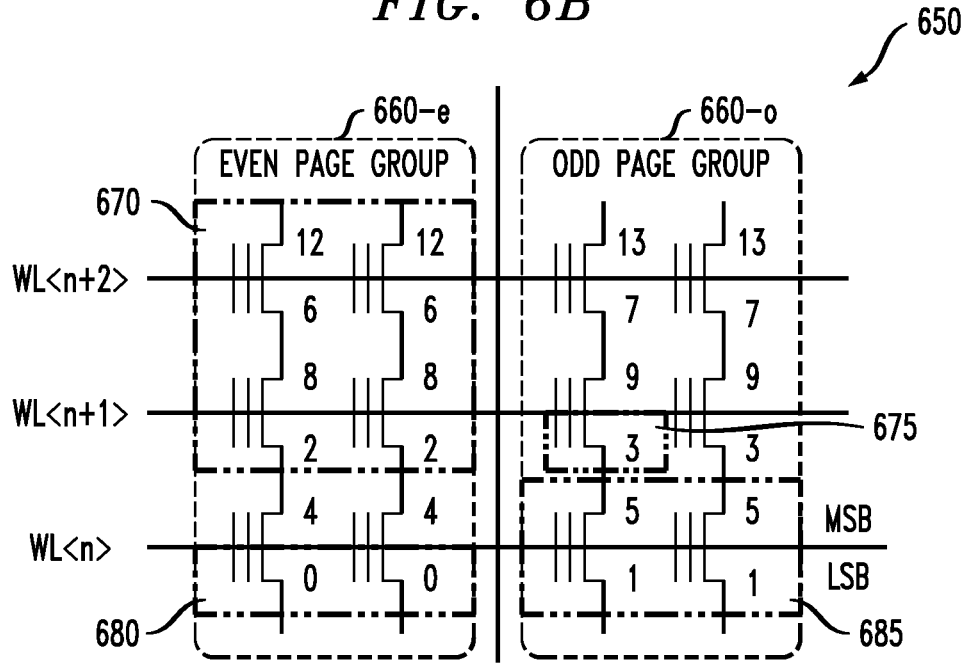
FIG. 6B illustrates variable scope decoding in accordance with aspects of the present invention.

FIG. 6B illustrates variable scope decoding in accordance with aspects of the present invention. For example, region 670 illustrates a full decoding of several wordlines using joint decoding techniques. Region 675 illustrates a windowed partial decoding of a portion of an LSB page of WL<n+1>, irrespective of the remaining bits in a page. Region 680 illustrates a windowed partial decoding of one page (LSB page of WL<n>), irrespective of the other pages in the wordline. Finally, region 685 illustrates a windowed/full partial decoding of all pages (LSB and MSB) in a wordline (WL<n>).

FIG. 7 illustrates intra-wordline encoding using SCLDPC in accordance with an embodiment of the invention. As shown in FIG. 7, an exemplary wordline 700 comprises an LSB or lower page 710 and an MSB or upper page 720. For a convolutional-type LDPC code, such as an SCLDPC code, each page 710, 720 comprises a data area 740 allocated for data bits and a parity or spare area 750 allocated to parity bits. Generally, within a wordline, some pages are less error prone than others. An aspect of the present invention recognizes that a portion of the spare area 750 can be allocated among the pages in a wordline based on the relative error probabilities of each page. For example, in a four-level cell (also known as MLC) storing two bits per cell and using Gray mapping {11, 01, 00, 10} as discussed above, MSB pages are typically more error prone than LSB pages when the read voltages are not calibrated. Hence, for an exemplary four-level cell without loss of generality, LSB pages require significantly less parity (less error correcting capability) than MSB pages. The present invention recognizes that the continuous and variable SCLDPC codes permit a portion of the spare area 750 of one page to be allocated to a different page and to be used for stronger ECC codes with lower code rates.

Thus, as shown in FIG. 7, an aspect of the present invention extends the MSB codeword of SCLDPC codes into the spare area 750 of the LSB page. For on-the-fly decoding in a normal mode, the MSB page 720 is partially decoded using the data area 740 and spare area 750 of the MSB page only. Similarly, during on-the-fly decoding in a normal mode, the LSB page 710 is fully decoded using the data area 740 and spare area 750 of the LSB page only.

In a recovery mode, when, for example, decoding of the MSB page during normal mode fails, the MSB page 720 is fully decoded using the data area 740 and spare area 750 of the MSB page and an extended spare area 760 from the partial LSB spare area. This requires that in addition to the MSB page, the spare area 760 of the LSB page is read, either by reading the portion of the spare area 760, or the spare area 750 of the LSB page or the whole LSB page 710.

In a further embodiment of the invention, a portion of the data area 740 of one page is allocated to a different page and used for a strong ECC code with low code rate. For example, a portion of the data area 740 of the LSB page can be allocated to the SCLDPC code used to encode the MSB page such that a stronger code with lower code rate can be used to protect the data portion of the MSB page.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for encoding data for storage on a flash memory device, comprising:
   obtaining a plurality of bits to be stored on said flash memory device; and
   encoding said plurality or bits for storage as a page on said flash memory device using a convolutional-type low density parity check code.

2. The method of claim 1, further comprising the step of storing said encoded page on said flash memory device.

3. The method of claim 1, wherein said convolutional-type low density parity check code comprises a spatially coupled low density parity check code.

4. The method of claim 1, wherein said encoded page is decoded independently of other pages.

5. The method of claim 1, wherein a portion of said encoded page is decoded independently of other pages.

6. The method of claim 1, wherein said encoded page is decoded jointly with one or more additional pages in a wordline of said flash memory device.

7. The method of claim 1, wherein said encoded page is decoded jointly with one or more additional pages in at least one additional wordline of said flash memory device.

8. The method of claim 1, further comprising the step of encoding a plurality of pages in a wordline of said flash memory device in an incremental manner as user data becomes available by saving an encoder state until desired pages are encoded.

9. The method of claim 1, wherein said encoding step further comprises the step of encoding one or more parity bits in a parity area of said page, and wherein a portion of said parity area for at least one page of a given wordline is allocated for parity bits for at least one other page of said given wordline based on relative error probabilities of said pages.

10. A tangible machine-readable recordable storage medium for encoding data for storage on a flash memory device, wherein one or more software programs when executed by one or more processing devices implement the steps of the method of claim 1.

11. A flash memory system, comprising:
    one or more encoders for encoding a plurality of bits to be stored on a flash memory device using a convolutional-type low density parity check code.

12. The flash memory system of claim 11, further comprising a flash storage medium storing said encoded page on said flash memory device.

13. The flash memory system of claim 11, wherein said convolutional-type low density parity check code comprises a spatially coupled low density parity check code.

14. The flash memory system of claim 11, wherein said encoded page is decoded independently of other page.

15. The flash memory system of claim 11, wherein a portion of said encoded page is decoded independently of other pages.

16. The flash memory system of claim 11, wherein said encoded page is decoded jointly with one or more additional pages in a wordline of said flash memory device.

17. The flash memory system of claim 11, wherein said encoded page is decoded jointly with one or more additional pages in at least one additional wordline of said flash memory device.

18. The flash memory system of claim 11, wherein one or more of said encoders encode a plurality of pages in a wordline of said flash memory device in an incremental manner as user data becomes available by saving an encoder state until desired pages are encoded.

19. The flash memory system of claim 11, wherein one or more of said encoders encode one or more parity bits in a parity area of said page, and wherein a portion of said parity area for at least one page of a given wordline is allocated for parity bits for at least one other page of said given wordline based on relative error probabilities of said pages.

20. The flash memory system of claim 11, wherein said flash memory device comprises a plurality of cells each capable of storing at least two data levels per cell.

* * * * *